(12) United States Patent
Tabuchi

(10) Patent No.: US 10,244,667 B2
(45) Date of Patent: Mar. 26, 2019

(54) STORAGE APPARATUS AND STORAGE DEVICE MANAGEMENT PROGRAM

(71) Applicant: HITACHI, LTD., Tokyo (JP)

(72) Inventor: Toshihisa Tabuchi, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 15/763,222

(22) PCT Filed: Mar. 2, 2016

(86) PCT No.: PCT/JP2016/056478
§ 371 (c)(1),
(2) Date: Mar. 26, 2018

(87) PCT Pub. No.: WO2017/149708
PCT Pub. Date: Sep. 8, 2017

(65) Prior Publication Data
US 2018/0279513 A1    Sep. 27, 2018

(51) Int. Cl.
*H05K 7/20* (2006.01)
*G06F 1/20* (2006.01)
*G11B 33/14* (2006.01)

(52) U.S. Cl.
CPC .......... *H05K 7/20836* (2013.01); *G06F 1/20* (2013.01); *G11B 33/142* (2013.01); *H05K 7/20727* (2013.01)

(58) Field of Classification Search
CPC ........ H05K 7/20836; H05K 7/18; H05K 7/20; H05K 7/20727; H05K 7/20736;
(Continued)

(56) References Cited

U.S. PATENT DOCUMENTS 8,416,571 B2 * 4/2013 Mizumura ......... H05K 7/20836
361/679.48
2006/0120192 A1    6/2006 Miyamoto et al.
(Continued)

FOREIGN PATENT DOCUMENTS

JP    2006-163695 A    6/2006
JP    2007-179655 A    7/2007
(Continued)

OTHER PUBLICATIONS

International Search Report of PCT/JP2016/056478 dated Apr. 26, 2016 and Written Opinion.

*Primary Examiner* — Mandeep S Buttar
(74) *Attorney, Agent, or Firm* — Mattingly & Malur, PC

(57) ABSTRACT

A storage apparatus includes one or more chassis including a first housing for a chassis fan and a second housing for a plurality of storage devices. A plurality of modules have at least either one storage device or a storage device fan. Module connectors supporting each of the modules are provided so that the modules can be freely attachable/detachable. A fan air intake port that guides air outside the chassis to the chassis fan is formed in the first housing; and a fan air exhaust port that exhausts air in the chassis to outside of the chassis is formed in the second housing; wherein some module of the plurality of modules is configured of a storage device module in which the one storage device is modulized; and another module which is configured of a module which is at least either a fan-equipped storage device module or a fan module.

8 Claims, 13 Drawing Sheets

(58) Field of Classification Search
CPC .. H05K 7/20172; H05K 7/20136; G06F 1/20; G06F 1/187; G06F 1/181; G06F 3/0689; G06F 1/206; G06F 3/0614; G11B 33/128; G11B 33/142; G11B 33/125
USPC .... 361/679.31, 679.48, 679.33, 695, 679.46, 361/730, 679.02, 679.37, 694, 679.32, 361/679.4, 688, 796; 454/184; G9B/33.038, 33.034
See application file for complete search history.

(56) References Cited

U.S. PATENT DOCUMENTS

| | | |
|---|---|---|
| 2007/0171607 A1 | 7/2007 | Tanaka |
| 2008/0239656 A1 | 10/2008 | Sasagawa et al. |

FOREIGN PATENT DOCUMENTS

| | | |
|---|---|---|
| JP | 2008-251067 A | 10/2008 |
| JP | 2014-183062 A | 9/2014 |
| JP | 2014-216512 A | 11/2014 |

\* cited by examiner

FIG.11

| Item | Value |
|---|---:|
| Mount Location | 1 |
| Module Type | 2 |
| ID | AAAA |
| Temperature | 45 |
| Mount Location | 2 |
| Module Type | 3 |
| ID | - |
| Temperature | - |
| Mount Location | 2 |
| Module Type | 1 |
| ID | BBBB |
| Temperature | 50 |
| ... | ... |
|  |  |

STORAGE APPARATUS AND STORAGE DEVICE MANAGEMENT PROGRAM

TECHNICAL FIELD

The present invention relates to a storage apparatus and storage device management program for managing storage devices.

BACKGROUND ART

Since storage devices such as hard disk drives are heating elements, they adopt a cooling configuration by using, for examples, fans when storage media are mounted in a plurality of chassis. For example, PTL 1 describes an apparatus equipped with a plurality of dummy units attached to an empty space of a chassis in such a manner that the dummy units can be freely attachable or detachable; and the dummy units are configured so that they can be extended or contracted in two steps (see PTL 1). Also, there is an apparatus configured to exhaust air from, and cool, the entire apparatus by means of the operation of exhaust air fans located in an upper part of a chassis and the operation of cooling fans on an HDD (Hard Disk Drive) module basis (see PTL 2). Furthermore, PTL 3 describes that: electric heating plates of high thermal conductivity are placed to extend from an area close to a heat source and across an upper end face area of a storage chassis; a radiator plate is placed via Peltier elements in the upper end area of the storage chassis for each electric heating plate; and an electric current which is caused to run through each Peltier element is controlled according to a temperature of each storage equipment (see PTL 3).

Incidentally, when expanded chassis loaded with, for example, storage devices are mounted in high density in a drive box or the like, a configuration is adopted such that an expanded chassis is pulled out from the front side of the drive box and a storage device(s) is inserted from a part of the drive box other than its front face.

CITATION LIST

Patent Literature

PTL 1: Japanese Patent Application Laid-Open (Kokai) Publication No. 2006-163695
PTL 2: Japanese Patent Application Laid-Open (Kokai) Publication No. 2007-179655
PTL 3: Japanese Patent Application Laid-Open (Kokai) Publication No. 2014-216512

SUMMARY OF THE INVENTION

Problems to be Solved by the Invention

Storage devices which are compliant with standards such as SAS (SAN Attached Storage) or SATA (Serial ATA) as storage devices consume power of approximately 8 W at its maximum; however, when storage devices which are compliant with NVMe (Non-Volatile Memory Express) standards are used, they consume power of 25 W at its maximum. Accordingly, when the storage devices of high power consumption are mounted in high density, it is necessary to sufficiently cool each storage device.

It is an object of the present invention to efficiently cool the storage devices mounted in high density.

Means to Solve the Problems

In order to solve the above-described problems, the present invention includes: one or more chassis including a first housing unit for housing a chassis fan and a second housing unit for housing a plurality of storage devices; and a plurality of modules in which at least either one storage device of the plurality of storage devices or a storage device fan is modulized, wherein a fan intake port that guides air outside the chassis to the chassis fan is formed in the first housing unit; wherein a fan air exhaust port that exhausts the air in the chassis to outside of the chassis is formed in the second housing unit; wherein some module of the plurality of modules is configured of a storage device module in which the one storage device is modulized; and wherein another module is configured of a module which is at least either a fan-equipped storage device module in which the one storage device and the storage device fan are modulized, or a fan module in which the storage device fan is modulized.

Advantageous Effects of the Invention

According to the present invention, the storage devices mounted in high density can be cooled efficiently.

BRIEF DESCRIPTION OF DRAWINGS

FIG. 11 is a structure diagram of a management table.

DESCRIPTION OF EMBODIMENTS (Concept of the Invention)

A chassis is to house a chassis fan and a plurality of storage devices and a fan intake port for guiding the air outside the chassis to the chassis fan and a fan air exhaust port for exhausting the air within the chassis to the outside of the chassis are formed in the chassis; a plurality of modules, in which at least either one storage device of the plurality of storage devices or the storage device fan is modulized, are housed in the chassis; and some module of the plurality of modules is configured of a storage device module in which the one storage device is modulized, and another module is configured of a fan-equipped storage device module, in which the one storage device and the storage device fan are modulized, or a fan module in which the storage device fan is modulized.

First Embodiment

Figure 1:
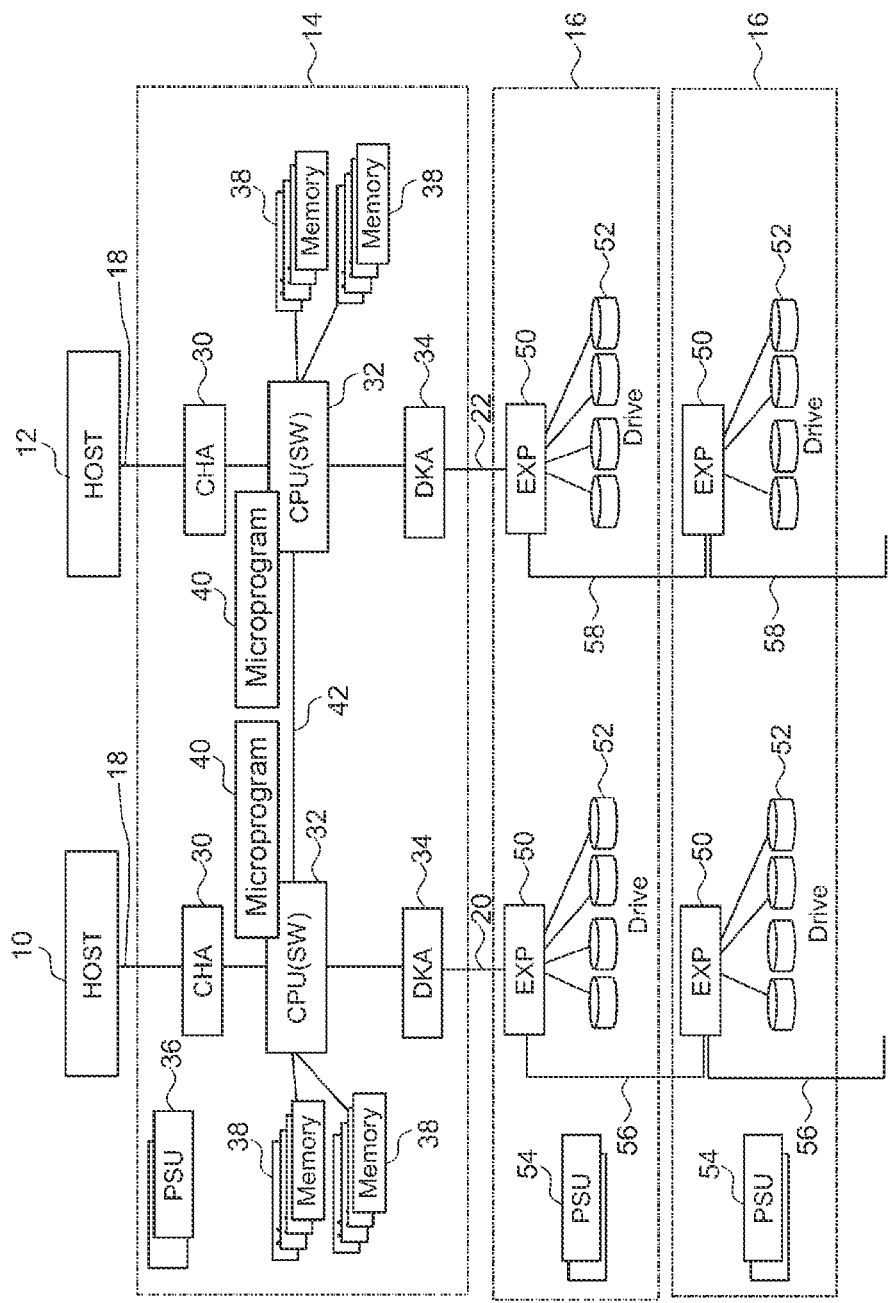
FIG. 1 is an overall configuration diagram of a storage system according to an embodiment of the present invention.

An embodiment of the present invention will be explained below with reference to the drawings. FIG. 1 is an overall configuration diagram of a storage system that shows an embodiment of the present invention. Referring to FIG. 1, the storage system is configured by including a plurality of host computers (hereinafter referred to as the hosts) 10, 12, a controller box 14, and a plurality of drive boxes 16. Each host 10, 12 is connected to the controller box 14 via a network 18 and the controller box 14 is connected to each drive box 16 via a network 20 or 22. Each of the controller box 14 and the drive boxes 16 is configured as a chassis which constitutes an element of a storage apparatus.

Each host 10, 12 is a computer device equipped with information processing resources such as a CPU (Central Processing Unit), memories, and input-output interfaces and is configured as, for example, a personal computer, a workstation, or a mainframe. Each host 10, 12 can access logical volumes, which are under the control of the storage apparatus, by issuing an access request, for example, a write request or a read request which designates the logical volumes provided by the storage apparatus.

The controller box 14 is configured by including a plurality of channel adapters (CHA) 30, a plurality of CPUs 32, a plurality of disk adapters (DKA) 34, and a plurality of power supply units (PSU) 36. Each channel adapter 30 transmits and receives information to and from the host 10 or 12 via the network 18; and when the channel adapter 30 receives an access request (a read request or a write request) from the host 10 or 12, it transfers the received access request to the CPU 32. Each CPU 32 has a microprogram 40 built-in and the CPUs 32 are connected to each other via an internal network 42. When an access request is input from the channel adapter 30, each CPU 32 executes processing in accordance with the input access request and transfers the processing result to the disk adapter 34. Furthermore, when each CPU 32 receives, for example, data from the disk adapter 34, the CPU 32 executes processing for storing the received data in memories 38 and executes processing for transferring the processing result to the host 10 or 12 via the channel adapter 30. Each disk adapter 34 is connected to each drive box 16 via the network 20 or 22 and is configured as a controller for executing data input-output processing on the storage devices in each drive box 16. Incidentally, each memory 38 is configured as, for example, a cache memory and is configured as a storage area for temporarily storing the processing results of each CPU 32.

Each drive box 16 is configured by including a plurality of expanders (EXP) 50, a plurality of drives 52, and a plurality of power supply units 54. One expander 50 is cascade-connected to other expanders 50 with each other via an internal network 56, while another expander 50 is cascade-connected with other expanders 50 via an internal network 58. Incidentally, the expanders 50 connected to the internal network 56 are connected to each drive 52 under their control and are also connected to the drives 52 under the control of the expanders 50 connected to the internal network 58. Similarly, the expanders 50 connected to the internal network 58 are connected to the drives under their control and are also connected to the drives 52 under the control of the expanders 50 connected to the internal network 56.

When each expander 50 receives a read access or write access from each disk adapter 34, the expander 50 selects a drive 52 designated by the read access or the write access from among the plurality of drives 52, executes the read access or the write access on the selected drive 52, and executes processing for reading data from the drive 52 designated by the read access and transferring the read data to the disk adapter 34 and executes processing for writing write data to the drive 52 designated by the write access.

The drive 52 is composed of a storage device for storing data. For example, an HDD (hard disk drive), a hard disk device, a semiconductor memory device, an optical disk device, a magnetooptical disk device, a magnetic tape device, or a flexible disk device can be used as each drive 52. For example, a SCSI (Small Computer System Interface) disk, a SATA (Serial ATA) disk, an ATA (AT Attachment) disk, a SAS (Serial Attached SCSI) disk can be used as the hard disk device; and for example, an SSD (Solid State Drive), a phase-change memory (Ovonic Unified Memory), or RRAM (registered trademark) (Resistance Random Access Memory) can be used as the semiconductor memory device.

Figure 2:
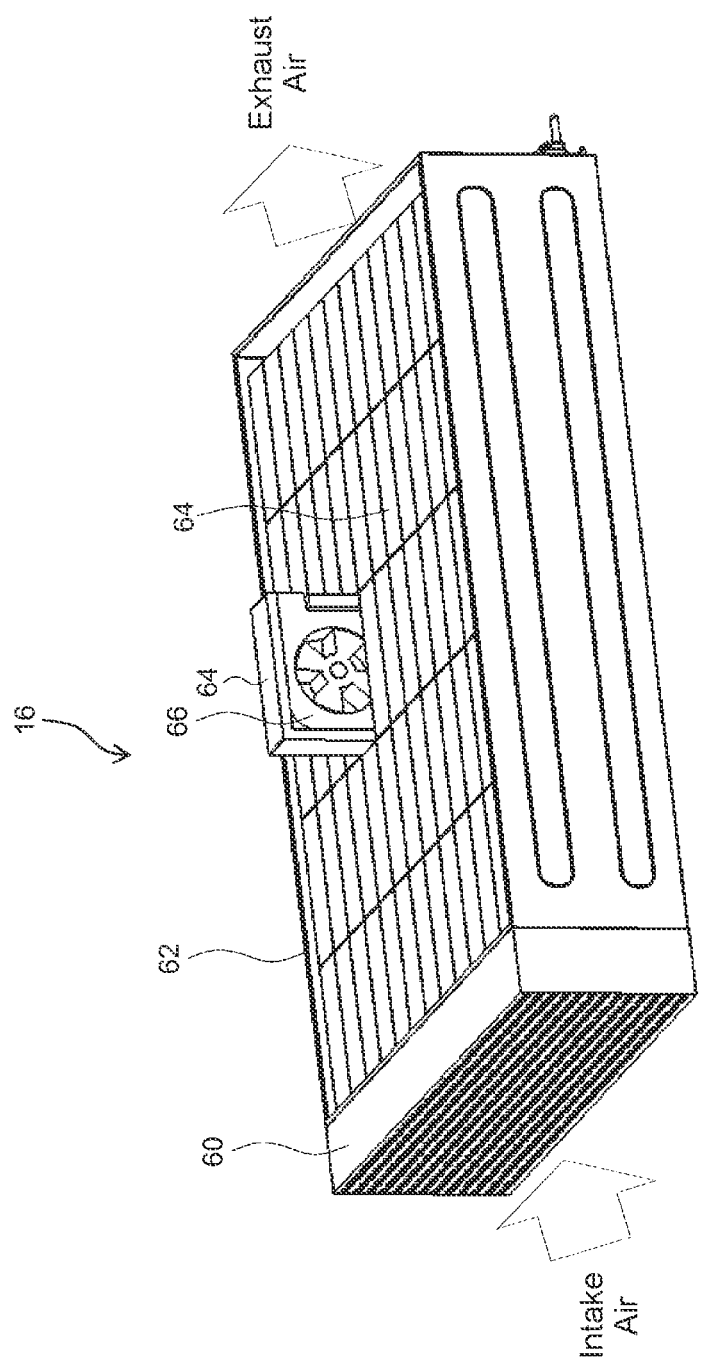
FIG. 2 is a perspective view of a drive box.

FIG. 2 is a perspective view of a drive box. Referring to FIG. 2, a drive box 16 includes a fan housing unit (a first housing unit) 60 and a canister housing unit (a second housing unit) 62 and is configured as a box-shaped chassis as a whole. The fan housing unit 60 includes a plurality of chassis fans built therein (illustration in the drawing is omitted). A fan air intake port (illustration in the drawing is omitted) for guiding the air outside the chassis into the chassis fan is formed in the fan housing unit 60. A fan air exhaust port (illustration in the drawing is omitted) for exhausting the air within the chassis to outside the chassis is formed in an area of the canister housing unit 62 on the opposite side of the fan air intake port of the fan housing unit 60. A plurality of connectors (illustration in the drawing is omitted), for example, 120 pieces of connectors are located in high density at the bottom of the canister housing unit 62 and are mounted on a circuit board (illustration in the drawing is omitted). The connectors are place substantially in parallel with each other along a virtual straight line connecting the fan air intake port and the fan air exhaust port. Each connector is loaded with a drive canister 64. Each drive canister 64 is configured as a module for housing, for example, a drive 52 or a circuit board or as a module for housing a fan. Under this circumstance, each canister 64 is configured as any one of a fan-equipped drive module in which a drive 52 and a fan 66 are modulize, a fan module in which only a fan 66 is modulized, and a drive module in which only a drive 52 is modulized. Each connector at the bottom of the canister housing unit 62 is configured as a module connector for supporting each drive canister 64 in a manner such that the drive canister 64 can be freely attachable/detachable. The module herein used means a combination of a plurality of elements such as the drive 52 or the fan, a circuit board, and a connector (a connector which can be mounted at the connector at the bottom of the canister housing unit 62) that is configured in a substantially rectangular parallelepiped shape as a whole with specified external dimensions.

Figure 3:
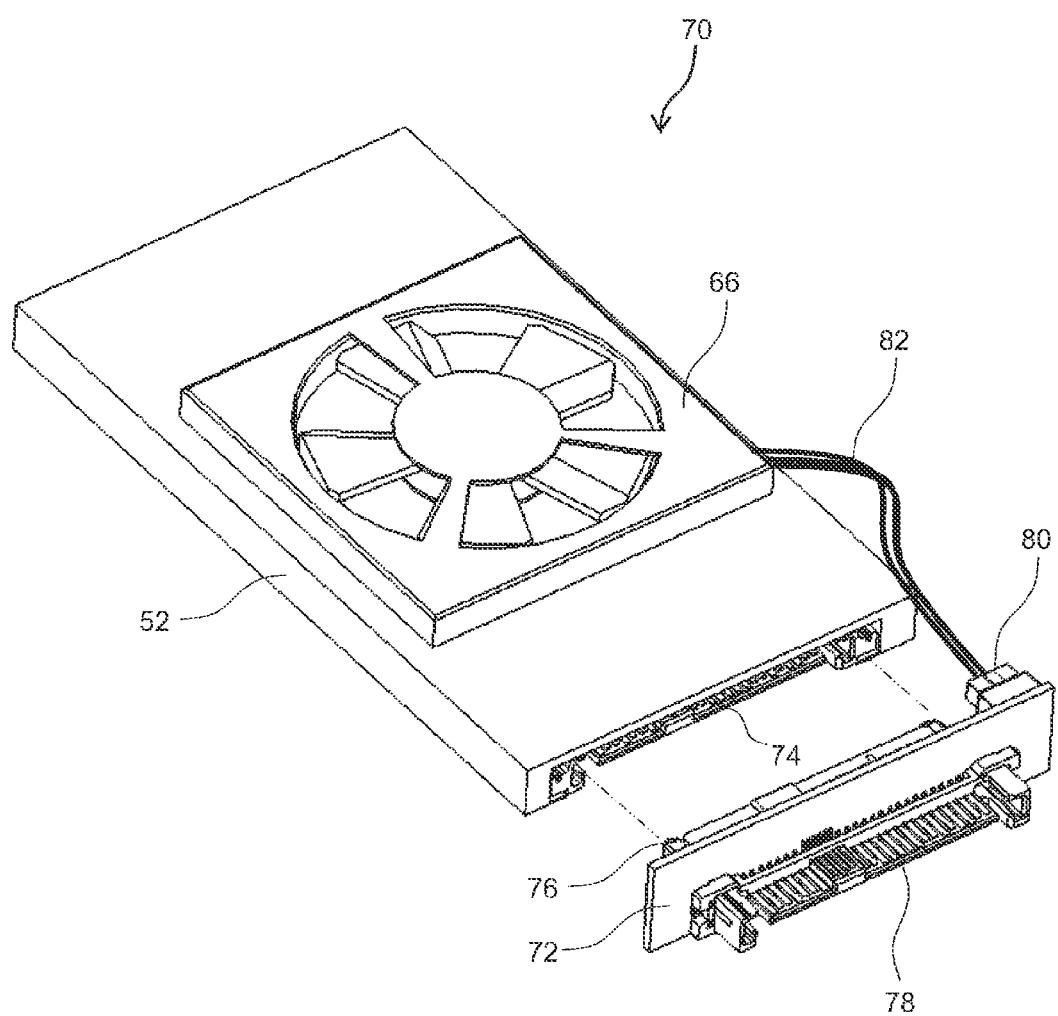
FIG. 3 is an exploded perspective view of a main part of a fan-equipped drive module.

FIG. 3 is an exploded perspective view of a main part of a fan-equipped drive module. Referring to FIG. 3, a fan-equipped drive module 70 is configured by including a drive 52, a thin fan 66, a printed circuit board (drive adapter) 72, a male drive connector 74, a female drive connector 76, a male drive connector 78, a fan connector 80, and a fan cable 82. The fan 66 is attached to a substantially central part of the drive 52 and is configured as a drive fan (storage device fan) that takes in the air from the back side of the drive 52 and exhausts the air to the front side of the drive 52. The printed circuit board 72 is loaded with the female drive connector 76, the male drive connector 78, and the fan connector 80. The female drive connector 76 is coupled to the male drive connector 74 mounted in the drive 52 and the male drive connector 78 is coupled to a female drive connector (which is not shown in the drawing) located in the canister housing unit 62 of the drive box 16. The fan connector 80 is coupled to a connector (which is not shown in the drawing) on the printed circuit board 72 and is connected to the fan 66 via the fan cable 82. The fan cable 82 is composed of an electric power line for transmitting the electric power to the fan 66 and a signal line for transmitting various types of signals to the fan 66 (neither one of the lines is illustrated in the drawing).

Figure 4:
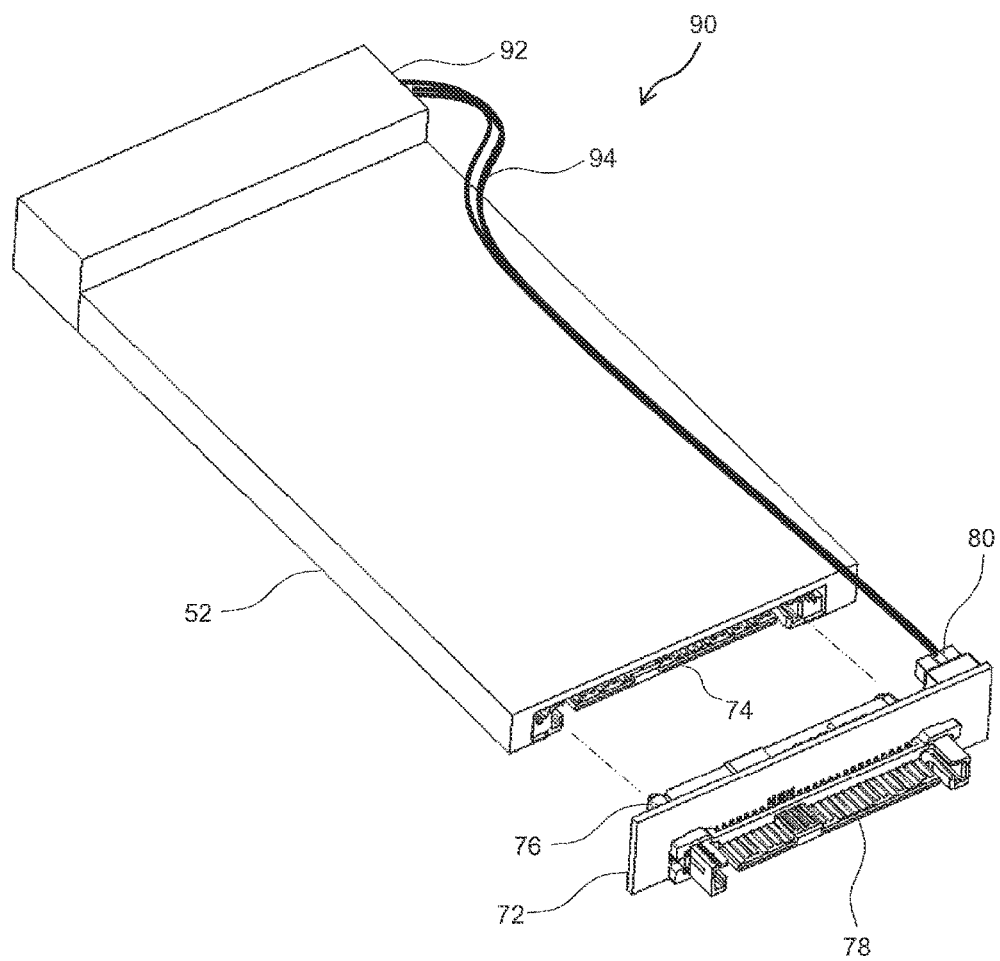
FIG. 4 is an exploded perspective view of a main part of another fan-equipped drive module.

FIG. 4 is an exploded perspective view of a main part of another fan-equipped drive module. Referring to FIG. 4, a fan-equipped drive module 90 is configured by including a drive 52, a fan 92, a printed circuit board (drive adapter) 72, a male drive connector 74, a female drive connector 76, a male drive connector 78, a fan connector 80, and a fan cable 94. The fan 92 is attached to the top (upper side) of the drive 52 and is configured as a drive fan (storage device fan) that takes in the air from the upper side of the fan 92 and exhausts the air to the drive 52 side. The printed circuit board 72 is loaded with the female drive connector 76, the male drive connector 78, and the fan connector 80. The female drive connector 76 is coupled to the male drive connector 74 mounted in the drive 52 and the male drive connector 78 is coupled to a female drive connector (which is not shown in the drawing) located in the canister housing unit 62 of the drive box 16. The fan connector 80 is coupled to a connector (which is not shown in the drawing) on the printed circuit board 72 and is connected to the fan 92 via the fan cable 94. The fan cable 94 is composed of an electric power line for transmitting the electric power to the fan 92 and a signal line for transmitting various types of signals to the fan 92 (neither one of the lines is illustrated in the drawing).

Figure 5:
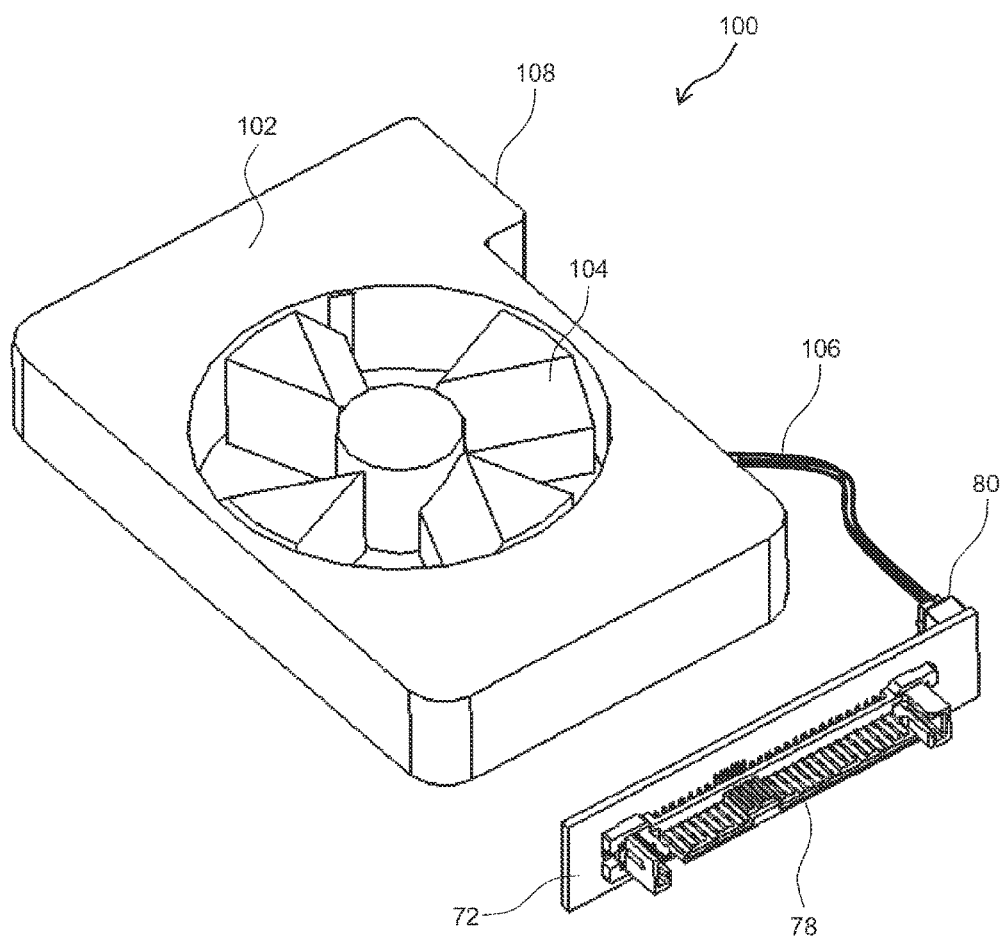
FIG. 5 is an exploded perspective view of a main part of a fan module.

FIG. 5 is an exploded perspective view of a main part of a fan module. Referring to FIG. 5, a fan module 100 is configured by including a fan case 102, a fan 104, a printed circuit board (drive adapter) 72, a male drive connector 78, a fan connector 80, and a fan cable 106. The fan 104 is located at a substantially central part of the fan case 102, which is of a box shape, and is configured as a drive fan (storage device fan) that takes in the air from the front side (upper side) of the fan 104 and exhausts the air through an exhaust port 108 towards the lateral side of its adjacent module. The printed circuit board 72 is loaded with the male drive connector 78 and the fan connector 80. The printed circuit board 72 is secured to the lower side of the fan case 102. The male drive connector 78 is coupled to a female drive connector (which is not shown in the drawing) located in the canister housing unit 62 of the drive box 16. The fan connector 80 is coupled to a connector (which is not shown in the drawing) on the printed circuit board 72 and is connected to the fan 104 via the fan cable 106. The fan cable 106 is composed of an electric power line for transmitting the electric power to the fan 104 and a signal line for transmitting various types of signals to the fan 104 (neither one of the lines is illustrated in the drawing). Incidentally, as a module, there is a drive module which is not loaded with a fan and in which a drive 52 is mounted via a connector on the printed circuit board 72.

Figure 6:
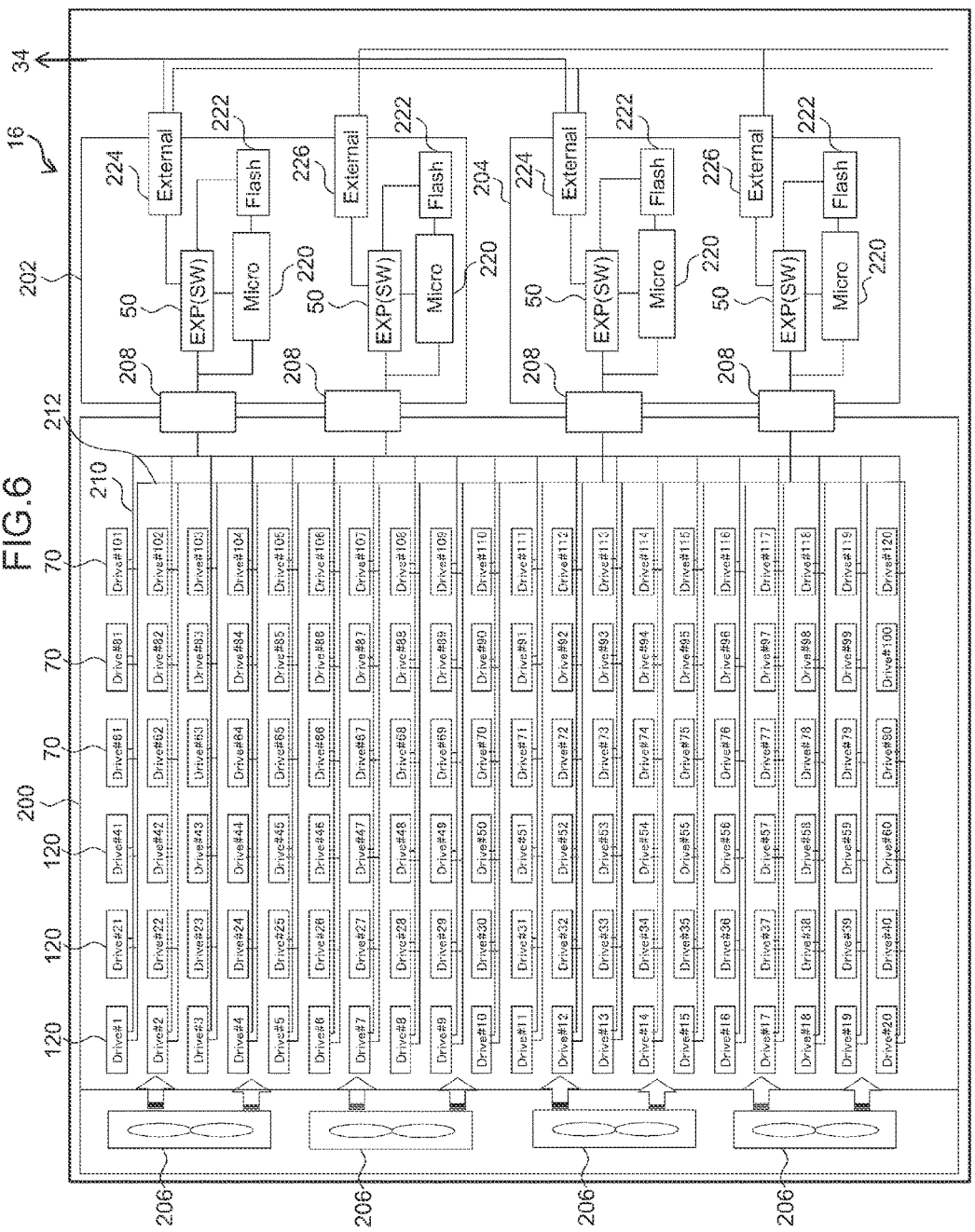
FIG. 6 is a block diagram for explaining an internal configuration of a high-performance drive box.

FIG. 6 is a block diagram for explaining the internal configuration of a high-performance drive box. Referring to FIG. 6, a high-performance (Hi-Performance) drive box 16 with the highest cooling performance includes a plurality of circuit boards 200, 202, 204, a plurality of chassis fans 206, and a plurality of connectors 208. The circuit board 200 is loaded with a plurality of modules on the air exhaust side of each chassis fan 206 and the modules are placed substantially in parallel with each other along a flowing direction of cooling air from the chassis fan 206. For example, three rows of drive modules 120 loaded with drives 52 No. 1 to No. 60 are mounted in the air-exhaust-side areas of the chassis fans 206. Furthermore, three rows of fan-equipped drive modules 70 loaded with drives 52 No. 61 to No. 120 are mounted in areas distant from the air exhaust side of the chassis fans 206. Incidentally, fan-equipped drive modules 90 can be mounted instead of the fan-equipped drive modules 70. The drive 52 in each module is connected via circuit patterns 210, 212 to any one of the connectors 208.

Each circuit board 202, 204 is configured by including a plurality of expanders (EXP) 50, microcontrollers (Micro) 220, flash memories (Flash) 222, and external connection connectors 224, 226. Each expander 50 is connected to the microcontroller 220, the flash memory 222, and the external connection connector 224 or the external connection connector 226 and is also connected to the connector 208. The microcontroller 220 is connected to the connector 208 and also connected to the flash memory 222. The external connection connectors 224 are connected to each other and are also connected to the disk adapter 34 via the network 20 or 22. The external connection connectors 226 are connected to each other and also connected to other drive boxes 16 via the internal network 56 or 58. The microcontroller 220 monitors each drive 52 and controls, for example, the rotation frequency of the fan 66 mounted in the fan-equipped drive module 70. When this happens, the microcontroller 220 controls the rotation frequency of the fan 66 based on, for example, a threshold value recorded in the flash memory 222.

The high-performance drive box 16 can sufficiently cool the drive modules 120, which are loaded with the drives 52 No. 1 to No. 60, with the cooling air from the chassis fans 206. On the other hand, regarding the drives 52 No. 61 to No. 120, each drive 52 can be sufficiently cooled by the fan 66 mounted in the fan-equipped drive module 70. Therefore, even if the plurality of drives 52 are mounted in high density in the high-performance drive box 16, each drive 52 in the high-performance drive box 16 can be cooled with high cooling performance.

Figure 7:
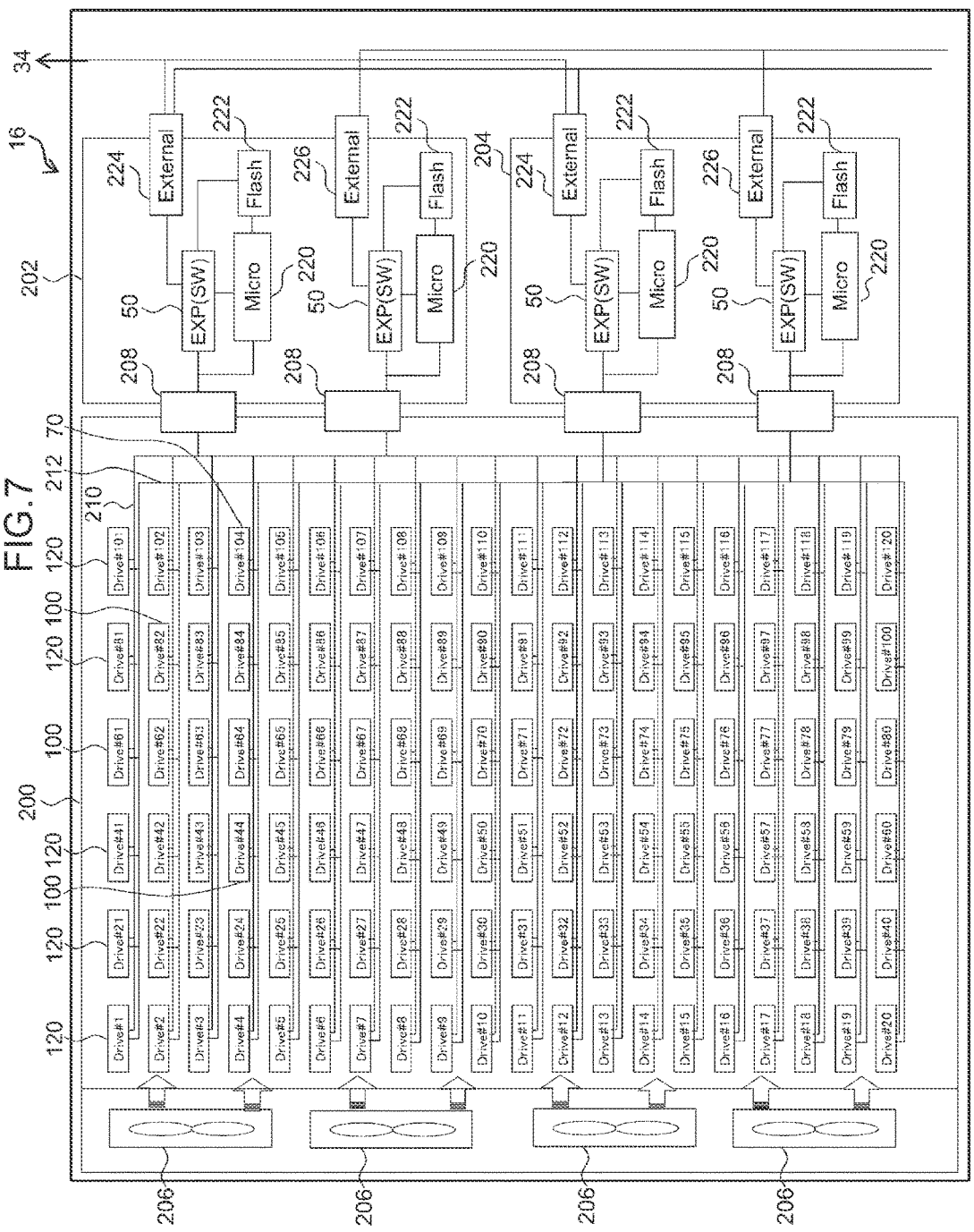
FIG. 7 is a block diagram for explaining an internal configuration of a middle-performance drive box.

FIG. 7 is a block diagram for explaining the internal configuration of a middle-performance drive box. Referring to FIG. 7, a middle-performance (Middle-Performance) drive box 16 with middle cooling performance includes a plurality of circuit boards 200, 202, 204, plurality of chassis fans 206, and a plurality of connectors 208. The circuit board 200 is loaded with a plurality of modules on the air exhaust side of each chassis fan 206. Regarding areas in the circuit board 200, two rows of drive modules 120 including drives 52 No. 1 to No. 40 are located in areas in the vicinity of the air exhaust side of the chassis fans 206; and multiple types of modules are located in a distributed manner in areas distant from the air exhaust side of the chassis fans 206. For example, fan modules 100 including the drives 52 Nos. 44, 48, 52, 56, 60, 61, 63, 65, 67, 69, 71, 73, 75, 77, 79, 82, 86, 90, 94, and 98, and drive modules 120 including the drives 52 Nos. 41 to 43, 45 to 47, 49 to 51, 53 to 55, 57 to 59, 62, 64, 66, 68, 70, 72, 74, 76, 78, 80, 81, 83 to 85, 87 to 89, 91 to 93, 95 to 97, 99, and 100 are mounted. Furthermore, fan-equipped drive modules 70 including the drives 52 Nos. 104, 108, 112, 116, and 120 and drive modules 120 including the drives 52 Nos. 101 to 103, 105 to 107, 109 to 111, 113 to 115, and 117 to 119 are mounted in areas most distant from the chassis fans 206.

After the fan 104 takes in the air from the front side, the fan module 100 exhausts the intake air from its lateral side. So, the fan modules 100 can efficiently cool the drives 52 in the drive modules 120 adjacent to the fan modules 100. There is fear that the drives 52 located in areas distant from the chassis fans 206 may not be cooled sufficiently; however, the fan-equipped drive modules 70 are mounted in these areas, so that the drives 52 in the fan-equipped drive modules 70 can be efficiently cooled by the fans 66. Incidentally, the middle-performance drive box 16 illustrated in FIG. 7 can be used as a high-performance drive box instead of the high-performance drive box 16 illustrated in FIG. 6.

Figure 8:
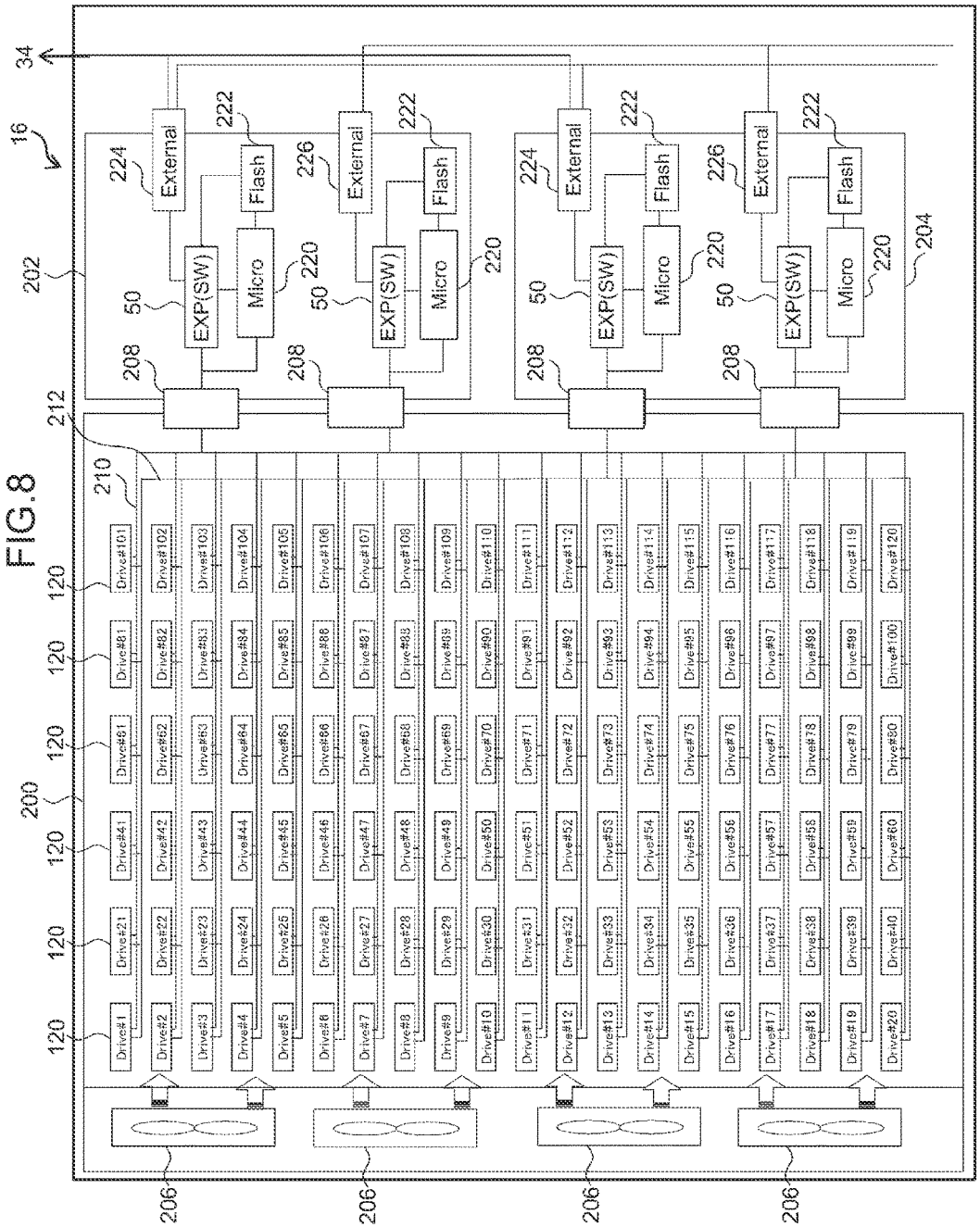
FIG. 8 is a block diagram for explaining an internal configuration of a low-performance drive box.

FIG. 8 is a block diagram for illustrating the internal configuration of a low-performance drive box. Referring to FIG. 8, a low-performance (Low-Performance) drive box 16 with the lowest cooling performance includes a plurality of circuit boards 200, 202, 204, a plurality of chassis fans 206, and a plurality of connectors 208. A plurality of modules are mounted on the circuit board 200 on the air exhaust side of each chassis fan 206. This circuit board 200 is loaded with only drive modules 120 including drives 52 of drives 120 No. 1 to No. 120. Each drive 52 in the drive modules 120 mounted on the circuit board 200 can be cooled by only the chassis fans 206. Therefore, it is desirable that drives with low power consumption should be used as the drives 52 mounted in the respective drive modules 120.

Figure 9:
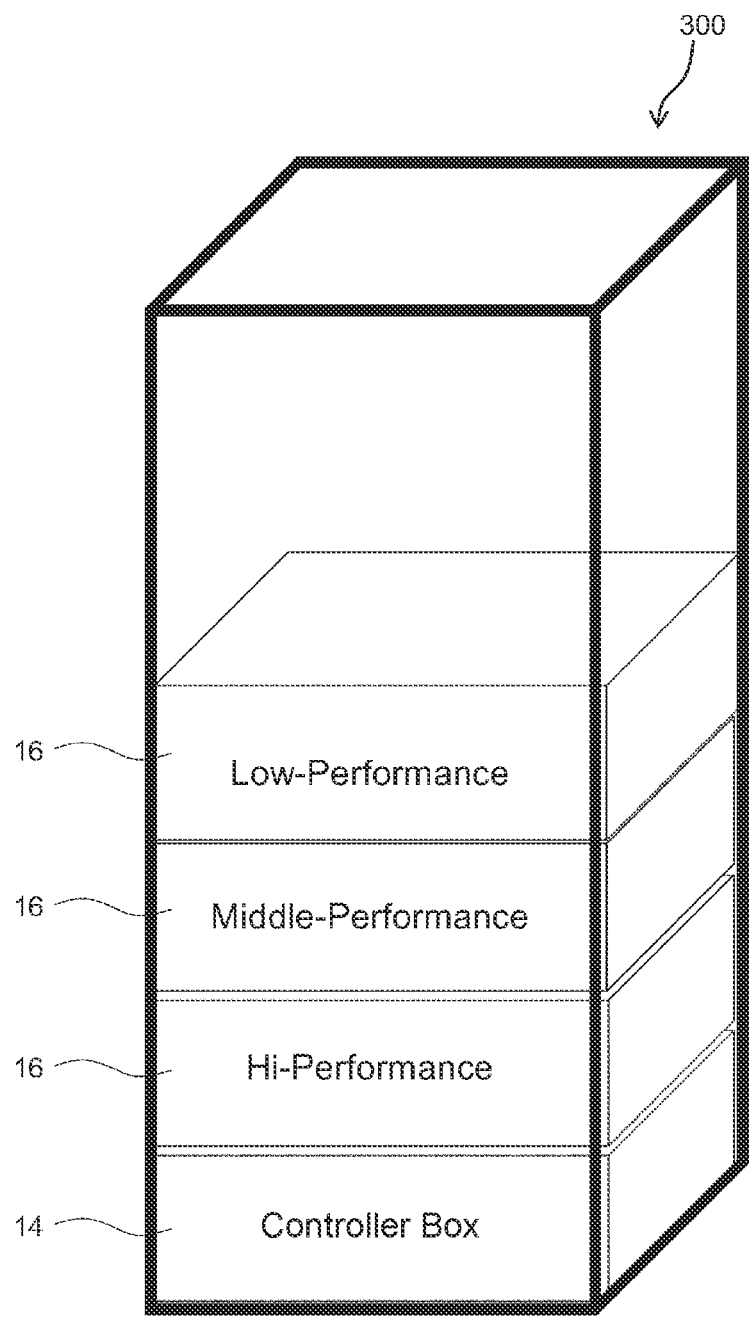
FIG. 9 is a perspective view of a chassis in which a plurality of drive boxes are mounted.

FIG. 9 is a perspective view of a chassis loaded with a plurality of drive boxes. Referring to FIG. 9, a chassis 300 is loaded with, from its bottom side, a controller box 14 and a plurality of drive boxes 16 in multiple shelves above the controller box 14.

Under this circumstance, a high-performance drive box 16 is mounted on the controller box 14, a middle-performance drive box 16 is mounted above the high-performance drive box 16, and a low-performance drive box 16 is further mounted above the middle-performance drive box 16. When the drive boxes are loaded so that the plurality of drive boxes 16 are piled over the controller box 14, the expanders 50 in the respective drive boxes 16 are sequentially cascade-connected and, therefore, latency (delay time) may occur due to switching processing of each expander 50. When this happens, I/O (Input/Output) performance of the expanders 50 which are located more logically or physically distant from the disk adapter 34 in the controller box 14 degrades. Accordingly, degradation of the I/O performance of the expanders 50 which is caused by the occurrence of the latency is inhibited by mounting the high-performance drive box 16 at the position closest to the controller box 14, mounting the middle-performance drive box 16 above the high-performance drive box 16, and further mounting the low-performance drive box 16 above the middle-performance drive box 16. Incidentally, when the chassis 300 is loaded with the high-performance drive box 16 and the middle-performance drive box 16 in multiple shelves above the controller box 14, the high-performance drive box 16 is configured as a lower-shelf chassis and the middle-performance drive box 16 is configured as an upper-shelf chassis.

Incidentally, a connector of a type that meets NVMe standards, for example, so-called SFF (Small Form Factor)-8639 is used as a connector mounted in each drive box 16.

Figure 10:
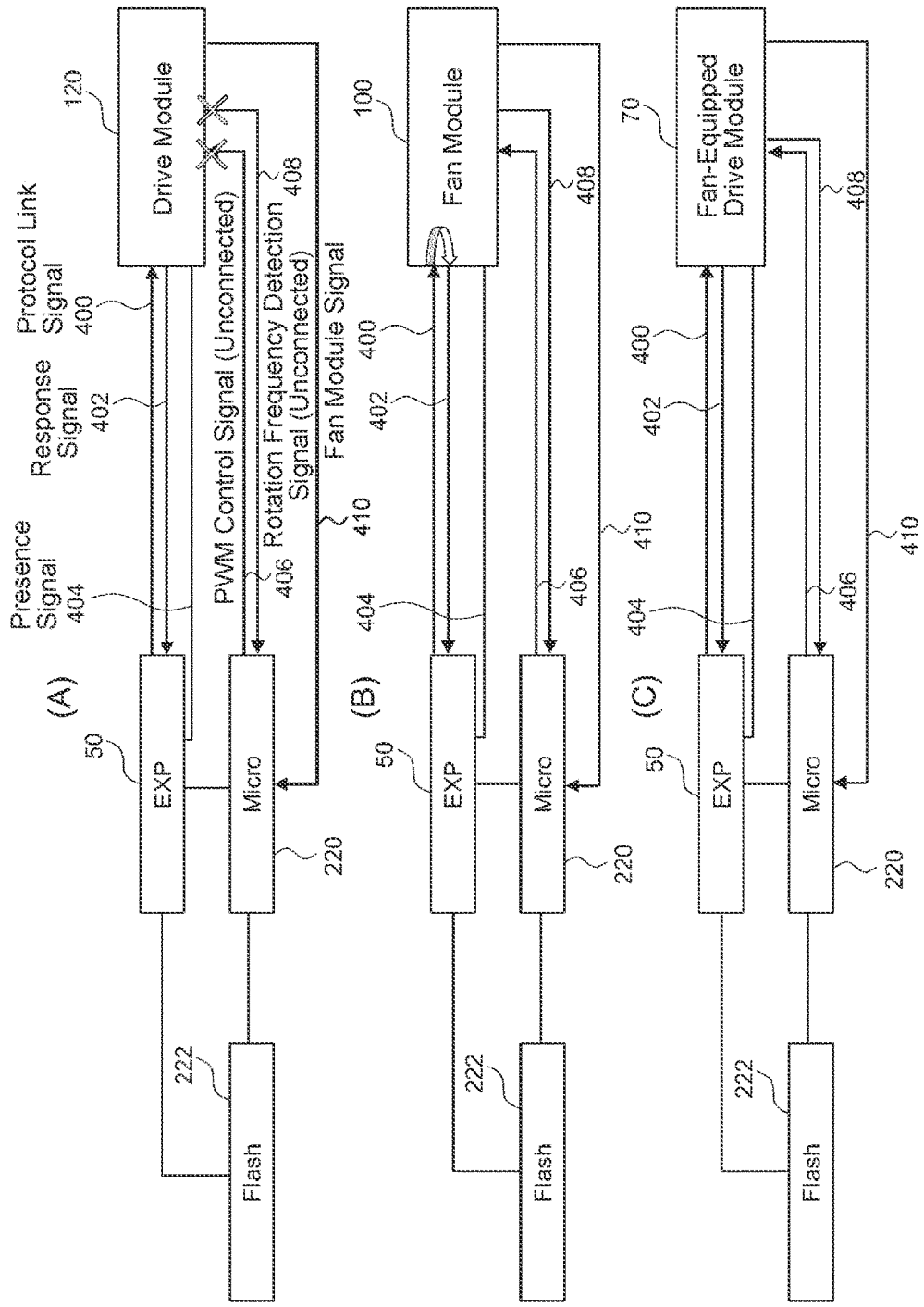
FIG. 10 is a block diagram for explaining connection relations of electric circuits in a drive box.

FIG. 10 is a block diagram for explaining connection relations between electric circuits in a drive box. Referring to FIG. 10(A), when the drive module 120 is mounted in the drive box 16, the expander 50 outputs a protocol signal 400 to the drive module 120, the drive module 120 outputs a response signal 402 and also outputs a low-level presence signal 404, which indicating that the module has been mounted, to the expander 50. On the other hand, the microcontroller 220 outputs a PWM control signal 406 for controlling fan rotations to the drive module 120. Under this circumstance, the drive module 120 is not equipped with a fan, so that the drive module 120 outputs a high-level fan module signal 410, which is a signal indicating that the fan is not mounted, and a rotation frequency detection signal 408 indicating that the rotation frequency is zero, to the microcontroller 220.

Referring to FIG. 10(B), when the fan module 100 is mounted in the drive box 16 and as the expander 50 outputs the protocol link signal 400 to the fan module 100, this protocol link signal 400 is directly looped back to the expander 50. The fan module 100 outputs the low-level presence signal 404, which indicates that the module has been mounted, to the expander 50. On the other hand, when the microcontroller 220 outputs the PWM control signal 406 to the fan module 100, the fan module 100 controls the rotations of the fan 104 in accordance with the PWM control signal 406. When this happens, the fan module 100 outputs the rotation frequency detection signal 408, which indicates the rotation frequency of the fan 104, to the microcontroller 220. Furthermore, the fan module 100 outputs the low-level fan module signal 410, as a signal indicating that the fan 104 is mounted, to the microcontroller 220.

Referring to FIG. 10(C), when the fan-equipped drive module 70 is mounted in the drive box 16 and as the expander 50 outputs the protocol link signal 400 to the fan-equipped drive module 70, the fan-equipped drive module 70 outputs the response signal 402 and the low-level presence signal 404, which indicates that the module has been mounted, to the expander 50.

On the other hand, the microcontroller 220 outputs the PWM control signal 406 to the fan-equipped drive module 70. As a result, the fan 66 in the fan-equipped drive module 70 rotates in accordance with the PWM control signal 406. When this happens, the fan-equipped drive module 70 outputs the rotation frequency detection signal 408 indicating the rotation frequency of the fan 66 and the fan module signal 410, which is a low-level signal indicating that the fan 66 has been mounted, to the microcontroller 220.

FIG. 11 is a structure diagram of a management table. Referring to FIG. 11, a management table 500: is a table that is managed by the expander 50 or the microcontroller 220 and stored in each flash memory 222; and is composed of an item 502 and a value 504. The item 502 stores a mount location 506, a module type 508, an ID (Identification) 510, and a temperature 512 in accordance with the number of the drives 52. The value 504 stores, for example, a value of each item 502.

The mount location 506 is information indicating a mount location of each drive 52 or module mounted in the drive box 16; and the mount location 502 stores any one of numbers, for example, No. 1 to No. 120 when 120 pieces of drives 52 are mounted.

The module type 508 is information for identifying any one of three module types including the drive 52. The module type 504 stores: the number "1" in a case of the drive module 120; the number "2" in a case of the fan-equipped drive module 70; and the number "3" in a case of the fan module 100.

The ID 510 is information for identifying the relevant drive 52; and, for example, when the drive 52 is a storage device that meets NVMe standards, the ID 510 stores information "AAAA." The temperature 512 is a temperature detected by an internal temperature sensor of the drive 52. For example, when the temperature of the drive 52 No. 1 is 45 degrees Celsius, the temperature 512 stores information "45."

Incidentally, the management table 500 can be used to manage, for example, the rotation frequency of the fan 66 or 104 mounted in the fan-equipped drive module 70 or the fan module 100, and a set temperature and threshold value for each drive 52. Under this circumstance, the microcontroller 220 can compare the temperature detected by the drive 52 with the set temperature and control the fan rotation frequency, depending on whether the detected temperature exceeds the set temperature or not. For example, when the detected temperature exceeds the set temperature, the microcontroller 220 outputs the PWM control signal 406 to increase the fan rotation frequency; and subsequently, when the detected temperature exceeds the set temperature, the microcontroller 220 can output the PWM control signal 406 to further increase the fan rotation frequency.

Figure 12:
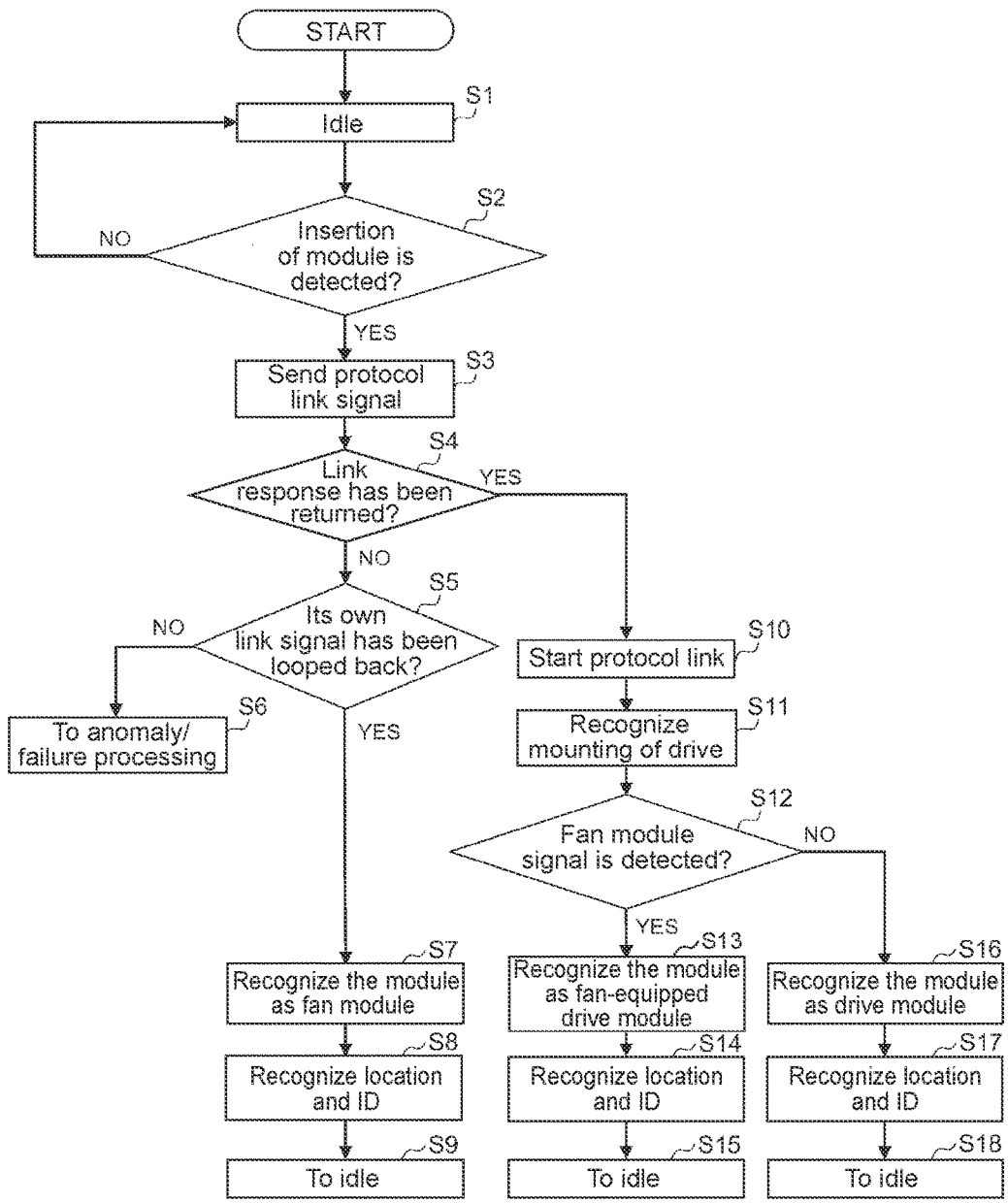
FIG. 12 is a flowchart for explaining the operation of an expander.

FIG. 12 is a flowchart for explaining the operation of the expander. Referring to FIG. 12, the expander 50 is firstly in an idle state (status) (S1) and judges whether a module has been inserted into any of the drive boxes 16. Specifically speaking, the expander 50 judges whether the insertion of the module into the drive box 16 is detected or not (S2). For example, the expander 50 judges whether or not it has received the low-level presence signal 404, indicating that a module has been mounted, from any one of the modules. When the expander 50 obtains a negative judgment result in step S2, the expander 50 returns to the processing of step S1; and when the expander 50 obtains an affirmative judgment result in step S2, the expander 50 issues the protocol link signal 400 to the module (S3) and judges whether there is a link response or not (S4). Specifically speaking, the expander 50 judges whether or not it has received the response signal 402 from the module.

When the expander 50 obtains a negative judgment result in step S4, the expander 50 judges whether its own link signal has been looped back or not (S5). Specifically speaking, the expander 50 judges whether or not the protocol link signal 400 which was transmitted to the module has been directly looped back as the response signal 402.

When the expander 50 obtains a negative judgment result in step S5, the expander 50 executes anomaly/failure processing. On the other hand, when the expander 50 obtains an affirmative judgment result in step S5, the expander 50 recognizes the module as a fan module 100 on the condition that the protocol link signal 400 has been directly looped back as the response signal 402 (S7), recognizes the location (mount position) of the fan module 100 from the response signal 402 and recognizes the ID of the fan based on the recognized location (S8), and then enters the idle state (status) (S9), and returns to the processing of step S1.

Furthermore, when the expander 50 obtains an affirmative judgment result in step S4, the expander 50: starts a protocol link on the condition that it has received the response signal 402 (S10); executes processing for recognizing mounting of the drive 52 which is mounted in the module (S11); and judges whether or not the microcontroller 220 detects the low-level fan module signal 410 from the module (S12).

When the expander 50 obtains an affirmative judgment result in step S12, that is, when the expander 50 receives a signal indicating that the fan module signal 410 is detected, from the microcontroller 220, the expander 50 recognizes the module as the fan-equipped drive module 70 (S13), recognizes the location of the fan-equipped drive module 70 based on the response signal 402 from the module and recognizes the ID of the drive 52 based on the recognized location (S14), then enters the idle state (status) (S15), and returns to the processing of step S1.

On the other hand, when the expander 50 obtains a negative judgment result in step S12, that is, when the microcontroller 220 does not detect the low-level fan module signal 410 from the module, the expander 50 recognizes the module as the drive module 120 (S16), recognizes the location of the drive module 120 based on the response signal 402 from the module and recognizes the ID of the drive 52 based on the recognized location (S17), then enters the idle state (status) (S18), and returns to the processing of step S1.

Figure 13:
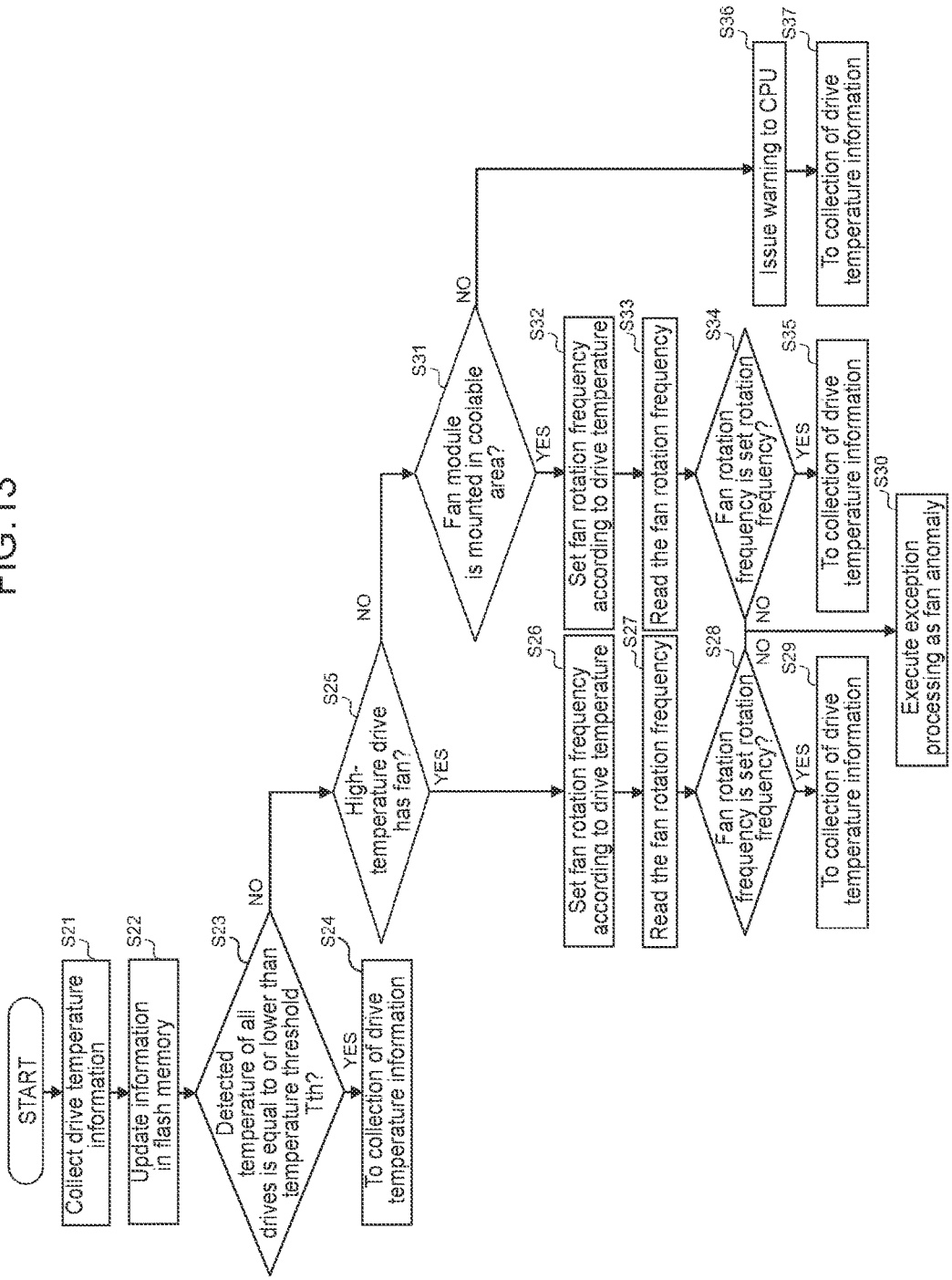
FIG. 13 is a flowchart for explaining a method for managing the temperature of the expander.

FIG. 13 is a flowchart for explaining a method for managing the temperature of the expander. Referring to FIG. 13, the expander 50: regularly collects drive temperature information from an internal temperature sensor which is built in each drive 52 (S21); recognizes the collected drive temperature information as the detected temperature of each drive 52 and updates information (temperature 512) of the management table 500 (S22); and judges whether or not the detected temperature of each of all the drives 52 is equal to or less than a temperature threshold Tth (S23).

When the expander 50 obtains an affirmative judgment result in step S23, the expander 50 executes processing for collecting the drive temperature information from each drive 52 (S24) and returns to the processing of step S21.

On the other hand, when the expander 50 obtains a negative judgment result in step S23, that is, when the temperature of at least one drive 52 exceeds the temperature threshold Tth, the expander 50 judges whether the high-temperature drive 52 with the detected temperature in excess of the temperature threshold Tth has a fan or not (S25).

When the expander 50 obtains an affirmative judgment result in step S25, the expander 50: sets a fan rotation frequency according to the drive temperature to the fan of the module in which the high-temperature drive 52 is mounted (S26); reads the rotation frequency of the fan from the microcontroller 220 (S27); and judges whether the rotation frequency of the fan is a set rotation frequency or not (S28).

When the expander 50 obtains an affirmative judgment result in step S28, the expander 50 starts processing for collecting the drive temperature information (S29) and then returns to the processing of step 21; and when the expander 50 obtains a negative judgment result in step S28, the expander 50 executes exception processing for a fan anomaly, for example, processing for generating an alarm (S30) and then terminates the processing in this routine.

On one hand, when the expander 50 obtains a negative judgment result in step S25, the expander 50 judges whether or not the fan module 100 is mounted in a coolable area that is an area where the high-temperature drive is mounted (S31).

When the expander 50 obtains an affirmative judgment result in step S31, the expander 50: sets the fan rotation frequency according to the drive temperature (S32); reads the fan rotation frequency from the microcontroller 220 (S33); and judges whether the fan rotation frequency is the set rotation frequency or not (S34).

When the expander 50 obtains a negative judgment result in step S34, the expander 50 executes the exception processing for the fan anomaly (S30) and then terminates the processing in this routine; and when the expander 50 obtains an affirmative judgment result in step S34, the expander 50 executes processing for collecting the temperature information of the drive 52 (S35) and returns to the processing of step S21.

On the other hand, when the expander 50 obtains a negative judgment result in step S31, that is, when it is impossible to cool the high-temperature drive, the expander 50: executes processing for issuing a warning to the CPU 32 (S36); then starts processing for collecting the temperature information of the drive 52 (S37); and returns to the processing of step S21. Subsequently, the expander 50 repeats the processing of steps S21 to S37.

According to this embodiment, the storage devices mounted in high density can be cooled efficiently.

Incidentally, the present invention is not limited to the above-described embodiments and includes various variations. For example, the expander 50, the microcontroller 220, and the flash memory 222 can be integrated with each other and the integrated unit can be used as a drive controller or drive computer for transmitting and receiving information to and from each module mounted in the drive box (chassis) 16 and managing the position and type of each module. In this case, a storage device management program to be executed by the drive controller or drive computer can be stored as a program in the flash memory 222 of a storage medium. The aforementioned embodiments have been described in detail in order to explain the invention in an easily comprehensible manner and are not necessarily limited to those having all the configurations explained above. Furthermore, part of the configuration of a certain embodiment can be replaced with the configuration of another embodiment and the configuration of another embodiment can be added to the configuration of a certain embodiment. Also, part of the configuration of each embodiment can be added to, deleted from, or replaced with, the configuration of another configuration.

Furthermore, part or all of the aforementioned respective configurations, functions, and so on may be realized by hardware by, for example, designing them in integrated circuits. Also, each of the aforementioned configurations, functions, and so on may be realized by software by having processors interpret and execute programs for realizing each of the functions. Information such as programs, tables, and files for realizing each of the functions can be recorded and retained in memories, storage devices such as hard disks and SSDs (Solid State Drives), or storage media such as IC cards, SD cards, and DVDs.

REFERENCE SIGNS LIST 10, 12: host
14: controller box
16: drive box
18: network
30: channel adapter
32: CPU
34: disk adapter
50: expander
52: drive
60: fan housing unit
62: canister housing unit
66: fan
70: fan-equipped drive module
100: fan module
104: fan
120: drive module
220: microcontroller
222: flash memory

The invention claimed is:

1. A storage apparatus with a plurality of storage devices for storing data, the storage apparatus comprising: one or more drive boxes including a first housing unit for housing a fan and a second housing unit for housing the storage devices; a plurality of modules in which at least either one storage device of the plurality of storage devices or a storage device fan is modulized; and a plurality of module connectors that are located in the second housing unit and supports each of the modules so that the module can be freely attachable or detachable; wherein a fan air intake port that guides air outside the one or more drive boxes to the fan is formed in the first housing unit; wherein a fan air exhaust port that exhausts the air in the one or more drive boxes to outside of the one or more drive boxes is formed in the second housing unit; wherein some module of the plurality of modules is configured of a storage device module in which the one storage device is modulized; wherein another module of the plurality of modules is configured of a module that is at least either a fan-equipped storage device module in which the one storage device and the storage device fan are modulized, or a fan module in which the storage device fan is modulized, and wherein the two or more of the storage device modules are mounted in an air-intake-side area of the second housing unit close to the first housing unit: the fan-equipped storage device module is provided in plurality and two or more of the storage device modules and two or more of the fan-equipped storage device modules are mounted in an air-exhaust-side area of the second housing unit close to the fan air exhaust port; and the fan module is provided in plurality and two or more of the fan modules and two or more of the storage device modules are mounted in an intermediate area between the air-intake-side area and the air-exhaust-side area of the second housing unit.

2. The storage apparatus according to claim 1, wherein the another module of the plurality of modules is configured of the fan-equipped storage device module and is mounted in an air-exhaust-side area which is an area within the second housing unit distant from the fan air intake port and close to the fan air exhaust port.

3. The storage apparatus according to claim 1, wherein the storage device modules and the fan-equipped storage device modules are located in a distributed manner in the air-exhaust-side area; and wherein the storage device fan for the fan-equipped storage device module cools the storage device in the fan-equipped storage device module and also cools the storage devices in the storage device modules adjacent to the fan-equipped storage device module.

4. The storage apparatus according to claim 1, wherein the storage device modules and the fan modules are located in a distributed manner in the intermediate area; and wherein the storage device fan for the fan module cools the storage devices in the storage device modules adjacent to the fan module.

5. The storage apparatus according to claim 1,
wherein the storage device for the fan-equipped storage device module is configured of a storage device with higher power consumption than that of a storage device for the storage device module.

6. The storage apparatus according to claim 1, further comprising a chassis having multiple shelves, wherein the one or more drive boxes are located on multiple shelves on top of a control box that includes a processor, and wherein regarding the one or more drive boxes, two or more of the fan-equipped storage device modules and two or more of the storage device modules are mounted in a distributed manner on a lower-shelf of said chassis within the one or more drive boxes close to the processor and two or more of the storage device modules and two or more of the fan modules are mounted in a distributed manner on an upper-shelf of said chassis within the one or more drive boxes located on an upper shelf of said chassis that is located on top of the lower-shelf of said chassis.

7. The storage apparatus according to claim 1, further comprising: a drive controller that transmits and receives information to and from each module mounted in the one or more drive boxes and manages a position and type of each module, wherein the drive controller collects temperature information from a storage device located in a module in which the storage device exists, from among the modules; the drive controller compares a device temperature obtained from the collected temperature information with a temperature threshold; when the device temperature exceeds the temperature threshold, the drive controller judges whether or not the storage device fan exists in the module of a high-temperature storage device which has the device temperature in excess of the temperature threshold; when it is determined that the storage device fan exists in the module of the high-temperature storage device, the drive controller controls a rotation frequency of the storage device fan according to a set rotation frequency in accordance with the device temperature of the high-temperature storage device; when it is determined that the storage device fan does not exist in the module of the high-temperature storage device, the drive controller judges whether or not the fan module is mounted in a coolable area of the module of the high-temperature storage device; and when it is determined that the fan module is mounted in the coolable area, the drive controller controls the rotation frequency of the storage device fan of the fan module according to the set rotation frequency in accordance with the device temperature of the high-temperature storage device.

8. The storage apparatus according to claim 7,
wherein when the drive controller transmits a protocol link signal to the module of the high-temperature storage device and then receives a response signal in response to the protocol link signal from the module of the high-temperature storage device and receives a fan module signal, which indicates that the storage device fan is mounted, from the module of the high-temperature storage device, the drive controller recognizes the module of the high-temperature storage device as the fan-equipped storage device module and determines that the storage device fan exists in the module of the high-temperature storage device; and
wherein when the drive controller transmits a protocol link signal to the module of the high-temperature storage device and then the protocol link signal is directly looped back as a response signal from the module of the high-temperature storage device, the drive controller recognizes the module of the high-temperature storage device as the fan module and determines that the fan module is mounted in the coolable area.

* * * * *